(12) United States Patent
Shinihara et al.

(10) Patent No.: US 8,383,471 B1
(45) Date of Patent: Feb. 26, 2013

(54) SELF ALIGNED SIDEWALL GATE GAN HEMT

(75) Inventors: Keisuke Shinihara, Thousand Oaks, CA (US); Andrea Corrion, Santa Monica, CA (US); Miroslav Micovic, Thousand Oaks, CA (US); Paul B. Hashimoto, Los Angeles, CA (US); Shawn D. Burnham, Oxnard, CA (US); Hooman Kazemi, Thousand Oaks, CA (US); Peter J. Willadsen, Acton, CA (US); Dean C. Regan, Moorpark, CA (US)

(73) Assignee: HRL Laboratories, LLC, Malibu, CA (US)

( * ) Notice: Subject to any disclaimer, the term of this patent is extended or adjusted under 35 U.S.C. 154(b) by 64 days.

(21) Appl. No.: 13/083,916

(22) Filed: Apr. 11, 2011

(51) Int. Cl.
*H01L 21/338* (2006.01)

(52) U.S. Cl. .......... 438/167; 438/172; 257/E21.407

(58) Field of Classification Search .......... 438/167, 438/172; 257/E21.407
See application file for complete search history.

(56) References Cited

U.S. PATENT DOCUMENTS

| | | | |
|---|---|---|---|
| 4,701,423 A | 10/1987 | Szluk | |
| 4,745,082 A | 5/1988 | Kwok | |
| 4,992,387 A | 2/1991 | Tamura | |
| 5,298,444 A | 3/1994 | Ristow | |
| 5,409,849 A | 4/1995 | Kishita | |
| 5,512,517 A | 4/1996 | Bryant | |
| 5,793,082 A | 8/1998 | Bryant | |
| 5,808,347 A | 9/1998 | Kurlmoto | |
| 5,817,562 A | 10/1998 | Chang | |
| 6,100,173 A | 8/2000 | Gardner | |
| 6,448,140 B1 | 9/2002 | Liaw | |
| 2005/0258451 A1* | 11/2005 | Saxler et al. | 257/192 |
| 2008/0128753 A1* | 6/2008 | Parikh et al. | 257/194 |

OTHER PUBLICATIONS

M. Micovic, et al., "GaN HFET for W-band Power Applications", Electron Devices Meeting IEDM p. 1-3(2006).
T. Palacios, et al. "Ge-Spacer Technology in ALGN/Gan HEMTs for mm-Wave Applications", Electron Devices Meeting IEDM p. 787-789 (2005).
Q.Z., Liu, L.S.Yu, F. Deng and S.S. Lau, "Ni and Ni silicide Schottky contacts on n-GaN", Journal of Applied Physics 84 p. 881 (1998).
U.S. Appl. No. 12/792,529, filed Jun. 2, 2010, Miraslav Micovic.

* cited by examiner

*Primary Examiner* — Daniel Whalen
(74) *Attorney, Agent, or Firm* — Ladas & Parry

(57) ABSTRACT

A method of fabricating a GaN HEMT includes growing a first epitaxial layer on a substrate, growing a second epitaxial layer on the first epitaxial layer, growing a third epitaxial layer on the second epitaxial layer, depositing a first dielectric film on the third epitaxial layer, using dielectric films to form a first sidewall dielectric spacer, forming a sidewall gate adjacent the first sidewall dielectric spacer. The sidewall gate may be made to be less than 50 nm in length.

27 Claims, 9 Drawing Sheets

GROWING A FIRST EPITAXIAL LAYER, WHICH MAY BE AlGaN, A SECOND EPITAXIAL LAYER, WHICH MAY BE GaN, AND A THIRD EPITAXIAL LAYER, WHICH MAY BE AlGaN OR AlN ON A SUBSTRATE, WHICH MAY BE SAPPHIRE, SiC, SILICON, OR GaN — 200

OPTIONALLY DEPOSITING A HIGH-K GATE DIELECTRIC FILM, SUCH AS Al2O3, HfO2, TiO2, ETC. ON THE THIRD EPITAXIAL LAYER TO REDUCE GATE LEAKAGE AND PROTECT THE EPITAXIAL SURFACE DURING SUBSEQUENT PROCESSING — 202

DEPOSITING A FIRST DIELECTRIC FILM SUCH AS SiO2, SiN, Al2O3, POLYMERS, ETC., USING A DEPOSITION TECHNIQUE SUCH AS CHEMICAL VAPOR DEPOSITION (CVD), SPUTTERING, ATOMIC LAYER DEPOSITION (ALD), SPIN COATING, ETC., PATTERNING THE FIRST DIELECTRIC FILM BY OPTICAL LITHOGRAPHY, AND ETCHING OF THE FIRST DIELECTRIC FILM IN SELECTED REGIONS DOWN TO THE THIRD EPITAXIAL LAYER USING DRY PLASMA ETCHING. — 204

DEPOSITING A SECOND DIELECTRIC FILM SUCH AS SiO2, SiN, Al2O3, POLYMERS, ETC., USING A DEPOSITION TECHNIQUE SUCH AS CVD, SPUTTERING, ALD, SPIN COATING, ETC., TO THE DESIRED THICKNESS. — 206

FIG. 3A (A)

DRY PLASMA ETCHING THE SECOND DIELECTRIC FILM 20 BY REACTIVE ION ETCHING (RIE), OR INDUCTIVELY-COUPLED PLASMA REACTIVE ION ETCHING (ICP-RIE), ETC., TO FORM A FIRST SIDEWALL DIELECTRIC SPACER — 208

OPTIONALLY, INSTEAD OF PERFORMING STEP 202, DEPOSITING AT THIS POINT A HIGH-K GATE DIELECTRIC FILM, SUCH AS Al2O3, HfO2, TiO2, ETC., TO REDUCE GATE LEAKAGE AND PROTECT THE EPITAXIAL SURFACE DURING SUBSEQUENT PROCESSING. — 210

DEPOSITING A REFRACTORY GATE METAL, SUCH AS W, TiW, Ta, Mo, TaN, ETC., USING EVAPORATION, SPUTTERING, ALD, ETC., OR ALTERNATIVELY DEPOSITING A SACRIFICIAL GATE SUCH AS SILICON OR A DIELECTRIC MATERIAL FOR SUBSEQUENT REMOVAL VIA SELECTIVE ETCHING AND GATE METAL PLATING, OR ALTERNATELY DEPOSITING A SILICON GATE BY CVD FOR SUBSEQUENT ALLOYING/SILICIDATION — 212

DRY PLASMA ETCHING OF THE GATE METAL, SACRIFICIAL GATE OR SILICON GATE, BY REACTIVE ION ETCHING (RIE), OR INDUCTIVELY-COUPLED PLASMA REACTIVE ION ETCHING (ICP-RIE), ETC., TO FORM A SIDEWALL GATE. 214

DEPOSITING A THIRD DIELECTRIC FILM SUCH AS SIO2, SIN, AL2O3, POLYMERS, ETC., USING A DEPOSITION TECHNIQUE SUCH AS CVD, SPUTTERING, ALD, SPIN COATING, ETC., TO A DESIRED THICKNESS FOR A SIDEWALL DIELECTRIC SPACER. 216

DRY PLASMA ETCHING THE THIRD DIELECTRIC FILM BY REACTIVE ION ETCHING (RIE), OR INDUCTIVELY-COUPLED PLASMA REACTIVE ION ETCHING (ICP-RIE), ETC., TO FORM SECOND SIDEWALL DIELECTRIC SPACER. 218

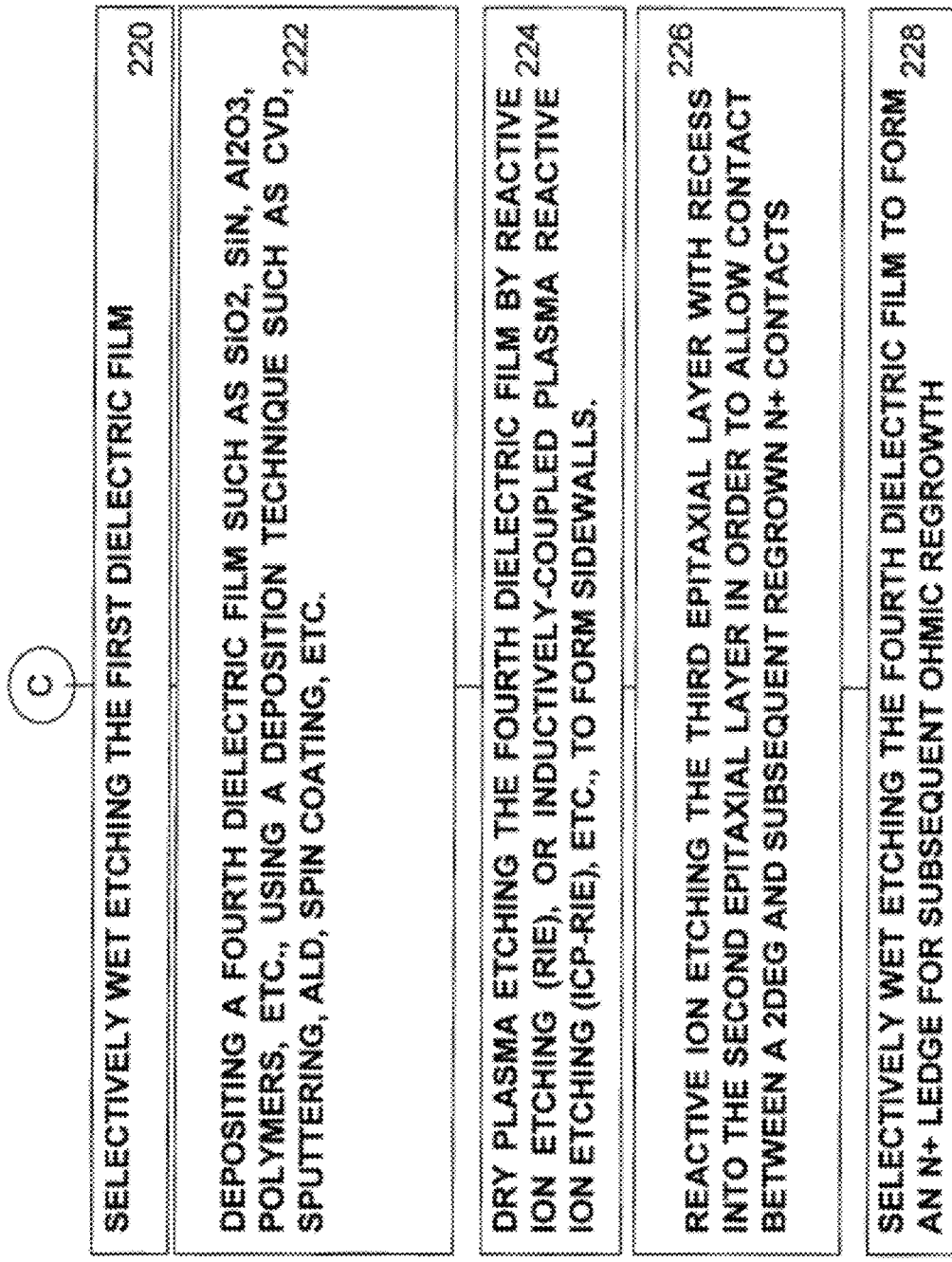

SELECTIVELY WET ETCHING THE FIRST DIELECTRIC FILM ⎯220

DEPOSITING A FOURTH DIELECTRIC FILM SUCH AS SIO2, SIN, Al2O3, POLYMERS, ETC., USING A DEPOSITION TECHNIQUE SUCH AS CVD, SPUTTERING, ALD, SPIN COATING, ETC. ⎯222

DRY PLASMA ETCHING THE FOURTH DIELECTRIC FILM BY REACTIVE ION ETCHING (RIE), OR INDUCTIVELY-COUPLED PLASMA REACTIVE ION ETCHING (ICP-RIE), ETC., TO FORM SIDEWALLS. ⎯224

REACTIVE ION ETCHING THE THIRD EPITAXIAL LAYER WITH RECESS INTO THE SECOND EPITAXIAL LAYER IN ORDER TO ALLOW CONTACT BETWEEN A 2DEG AND SUBSEQUENT REGROWN N+ CONTACTS ⎯226

SELECTIVELY WET ETCHING THE FOURTH DIELECTRIC FILM TO FORM AN N+ LEDGE FOR SUBSEQUENT OHMIC REGROWTH ⎯228

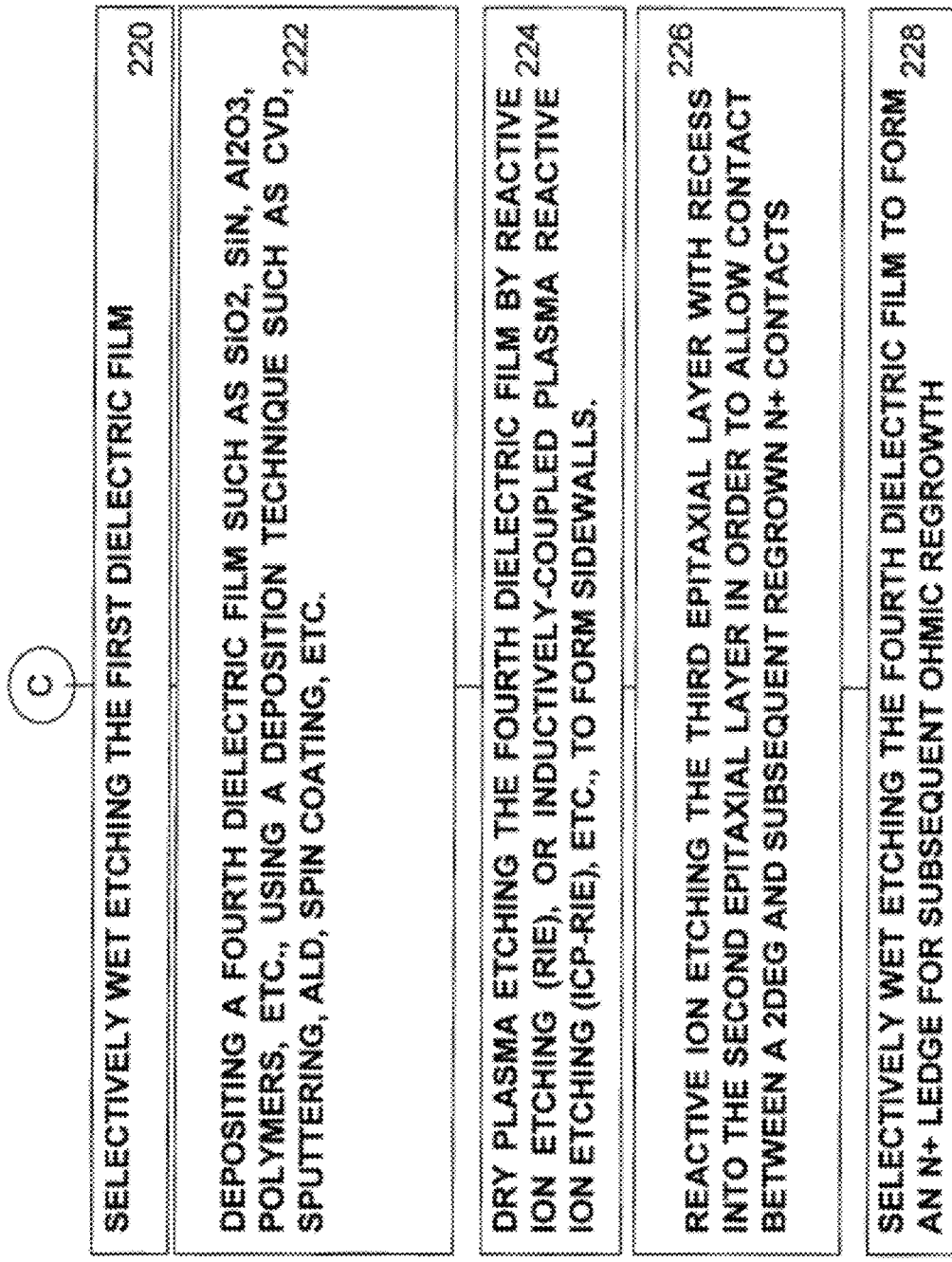

FIG. 3D

SELECTIVELY REGROWING N+ MATERIAL SUCH AS N+ GaN, N+ InN, OR N+ InGaN BY MOLECULAR BEAM EPITAXY (MBE) OR METALORGANIC CHEMICAL VAPOR DEPOSITION (CVD) FOR OHMIC CONTACTS  230

SELECTIVE WET ETCHING TO REMOVE DEFECTIVE (POLYCRYSTALLINE) REGROWN MATERIAL FROM THE FIRST AND SECOND DIELECTRIC SPACERS AND GATE  232

SKIPPING THIS STEP IN THE CASE OF DEPOSITING GATE METAL IN STEP 212.  234

IF A SACRIFICIAL GATE IS DEPOSITED IN STEP 212, THEN SELECTIVELY WET ETCHING THE SACRIFICIAL GATE AND THEN DEPOSITING GATE METAL SUCH AS Pt, Pd, OR Ni VIA ELECTROPLATING.

IF A SILICON GATE IS DEPOSITED IN STEP 212, THEN FORMING A SILICIDE GATE (FOR EXAMPLE, NiSi OR PtSi) BY EVAPORATION OR SPUTTERING OF METAL TO ALLOY WITH SILICON TO FORM THE SILICIDE GATE AND THEN SELECTIVELY ETCHING THE NON-ALLOYED METAL.

FIG. 3E

SELF ALIGNED SIDEWALL GATE GAN HEMT

TECHNICAL FIELD

This disclosure relates to high electron mobility transistors (HEMTs) and in particular to a GaN HEMT and method of fabricating a GaN HEMT with a self aligned gate.

BACKGROUND

The prior art for fabricating short gate-length GaN "t-gate" HEMTs uses e-beam lithography and alloyed ohmic contacts as described by M. Micovic, A. Kurdoghlian, P. Hashimoto, M. Hu, M. Antcliffe, P. J. Willadsen, W. S. Wong, R. Bowen, I. Milosavljevic, A. Schmitz, M. Wetzel, and D. H. Chow, "GaN HFET for W-band Power Applications", Electron Devices Meeting IEDM p. 1-3 (2006), and by T. Palacios, E. Snow, Y. Pei, A. Chakraborty, S. Keller, S. P. DenBaars, and U.K. Mishra, "Ge-Spacer Technology in AlGN/GaN HEMTs for mm-Wave Applications", Electron Devices Meeting IEDM p. 787-789 (2005).

The disadvantages of the prior art include poor gate length uniformity and control, reduced process throughput, increased process cost, poor source-drain spacing control, reduced gate aspect ratios leading to increased parasitic gate capacitances, and increased access resistances due to increased source-drain spacings and ohmic contact resistances.

Next-generation GaN HEMTs require aggressive scaling of device dimensions to reduce parasitic capacitances, device delays, and access resistances for improved high-frequency performance. In particular, ultra-short, nanometer-scale gate lengths and source-drain spacings are required in a robust, high throughput, reproducible, and reliable process.

The prior art fabrication of high-frequency GaN HEMTs uses e-beam lithography for gate foot and head definition followed by metal evaporation and lift-off. However, the aspect ratio of lithographically-defined gates is limited, which results in decreased gatehead-to-channel distance and increased parasitic capacitances. E-beam lithography is also time-consuming and expensive, which limits process throughput. Finally, lithographic definition of the source-drain spacing limits device dimensions in conventional GaN HEMTs, while high ohmic contact resistances due to the wide bandgap nature of the Al-containing Schottky layer result in increased access resistance.

What is needed is a method of fabricating GaN HEMTs with ultra-short, high aspect ratio gates and ultra-short source-drain spacings while providing excellent dimensional reproducibility and uniformity in a single optical lithography process step. Also needed are improvements over conventional e-beam lithography fabrication of high-speed GaN HEMTs in order to reduce processing time and cost, improve gate length and source-drain spacing uniformity, and reduce contact and access resistance. The embodiments of the present disclosure answer these and other needs.

SUMMARY

In a first embodiment disclosed herein, a method of fabricating a GaN HEMT comprises growing a first epitaxial layer on a substrate, growing a second epitaxial layer on the first epitaxial layer, growing a third epitaxial layer on the second epitaxial layer, depositing a first dielectric film on the third epitaxial layer, patterning the first dielectric film, etching the first dielectric film in selected regions down to the third epitaxial layer, depositing a second dielectric film over the remaining first dielectric film and an exposed portion of the third epitaxial layer to a desired thickness, etching the second dielectric film to form a first sidewall dielectric spacer, depositing a gate material, etching of the gate material to form a sidewall gate, depositing a third dielectric film to a desired thickness, etching the third dielectric film to form a second sidewall dielectric spacer, selectively wet etching the first dielectric film, depositing a fourth dielectric film, etching the fourth dielectric film to form sidewalls, reactive ion etching the third epitaxial layer with recess into the second epitaxial layer in order to allow contact between a 2DEG and regrown n+ ohmic contacts, and selectively wet etching the fourth dielectric film to form an n+ ledge for ohmic contact regrowth.

In another embodiment disclosed herein, a method of fabricating a GaN HEMT comprises growing a first epitaxial layer on a substrate, growing a second epitaxial layer on the first epitaxial layer, growing a third epitaxial layer on the second epitaxial layer, depositing a first dielectric film on the third epitaxial layer, patterning the first dielectric film, etching the first dielectric film in selected regions down to the third epitaxial layer, depositing a second dielectric film over the remaining first dielectric film and an exposed portion of the third epitaxial layer to a desired thickness, etching the second dielectric film to form a first sidewall dielectric spacer, depositing a sacrificial gate comprising silicon or a dielectric material, etching of the sacrificial gate to form a sacrificial sidewall gate, depositing a third dielectric film to a desired thickness, etching the third dielectric film to form a second sidewall dielectric spacer, selectively wet etching the first dielectric film, depositing a fourth dielectric film, etching the fourth dielectric film to form sidewalls, reactive ion etching the third epitaxial layer with recess into the second epitaxial layer in order to allow contact between a 2DEG and regrown n+ ohmic contacts, and selectively wet etching the fourth dielectric film to form an n+ ledge for ohmic contact regrowth.

In still another embodiment disclosed herein, a method of fabricating a GaN HEMT comprises growing a first epitaxial layer on a substrate, growing a second epitaxial layer on the first epitaxial layer, growing a third epitaxial layer on the second epitaxial layer, depositing a first dielectric film on the third epitaxial layer, patterning the first dielectric film, etching the first dielectric film in selected regions down to the third epitaxial layer, depositing a second dielectric film over the remaining first dielectric film and an exposed portion of the third epitaxial layer to a desired thickness, etching the second dielectric film to form a first sidewall dielectric spacer, depositing a silicon gate by chemical vapor deposition (CVD), etching the silicon gate to form a silicon sidewall gate, depositing a third dielectric film to a desired thickness, etching the third dielectric film to form a second sidewall dielectric spacer, selectively wet etching the first dielectric film, depositing a fourth dielectric film, etching the fourth dielectric film to form sidewalls, reactive ion etching the third epitaxial layer with recess into the second epitaxial layer in order to allow contact between a 2DEG and regrown n+ ohmic contacts, and selectively wet etching the fourth dielectric film to form an n+ ledge for ohmic contact regrowth.

In yet another embodiment disclosed herein, a GaN HEMT comprises a substrate, a buffer layer comprising a first epitaxial layer on the substrate, a channel comprising a second epitaxial layer on the buffer layer, a top barrier comprising a third epitaxial layer on the second epitaxial layer, a first sidewall dielectric spacer on the third epitaxial layer, a second sidewall dielectric spacer on the third epitaxial layer, a sidewall gate on the third epitaxial layer between the first sidewall dielectric spacer and the second sidewall dielectric spacer, a first ohmic contact for a source separated from the sidewall gate by the first sidewall dielectric spacer, a source contact on the first ohmic contact, a second ohmic contact for a drain separated from the sidewall gate by the second sidewall dielectric spacer, a drain contact on the second ohmic contact, a photoresist over the first ohmic contact, the source contact, the second ohmic contact, and the drain contact such that the first and second sidewall dielectric spacers and the sidewall gate protrude from the photoresist, and a gate head in contact with the sidewall gate, wherein a width of the gate head is wider than a width of the sidewall gate.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIGS. 3A-3F are flow diagrams of a method for fabricating a transistor with a self aligned gate in accordance with the present disclosure.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

The present disclosure describes a process that allows the fabrication of ultra-short gate-length devices (<50 nm) with high aspect ratio gates and nanometer-scale source-drain spacings in a single optical lithography step with excellent uniformity and reproducibility. At the same time, it reduces access resistances through regrowth of low-resistance ohmic contacts. The process incorporates dielectric offset spacers on the source and drain sides of the gate, which define the source-gate and gate-drain dimensions through ohmic regrowth. The thickness and composition of the spacers can be tailored independently for optimal device performance. For example, the electric field profile in the channel can be tailored to reduce parasitic capacitances and increase breakdown voltage.

In the sidewall deposition process described in this disclosure, the gate material and dielectric offset spacers are formed by deposition of multiple thin films along a vertical dielectric sidewall defined by a single optical lithography process. In this way, the gate length and spacer thicknesses defining the source-drain spacing are equal to the thickness of deposited material, which can be very precisely controlled with the use of conformal deposition techniques like atomic layer deposition (ALD), chemical vapor deposition (CVD), or sputtering. The process increases throughput, reduces cost, improves gate length accuracy, precision and uniformity, and enhances gate aspect ratio compared to e-beam lithography, while also permitting innovative electric field and device engineering with the adaptation of asymmetric dielectric offset spacers. Reduction of contact and access resistance may be achieved through self-aligned contact regrowth with the incorporation of a polarization-engineered n+ GaN ledge, as described in U.S. patent application Ser. No. 12/792,529, filed Jun. 2, 2010, which is incorporated herein by reference as though set forth in full.

Figures 1A, 1Z:
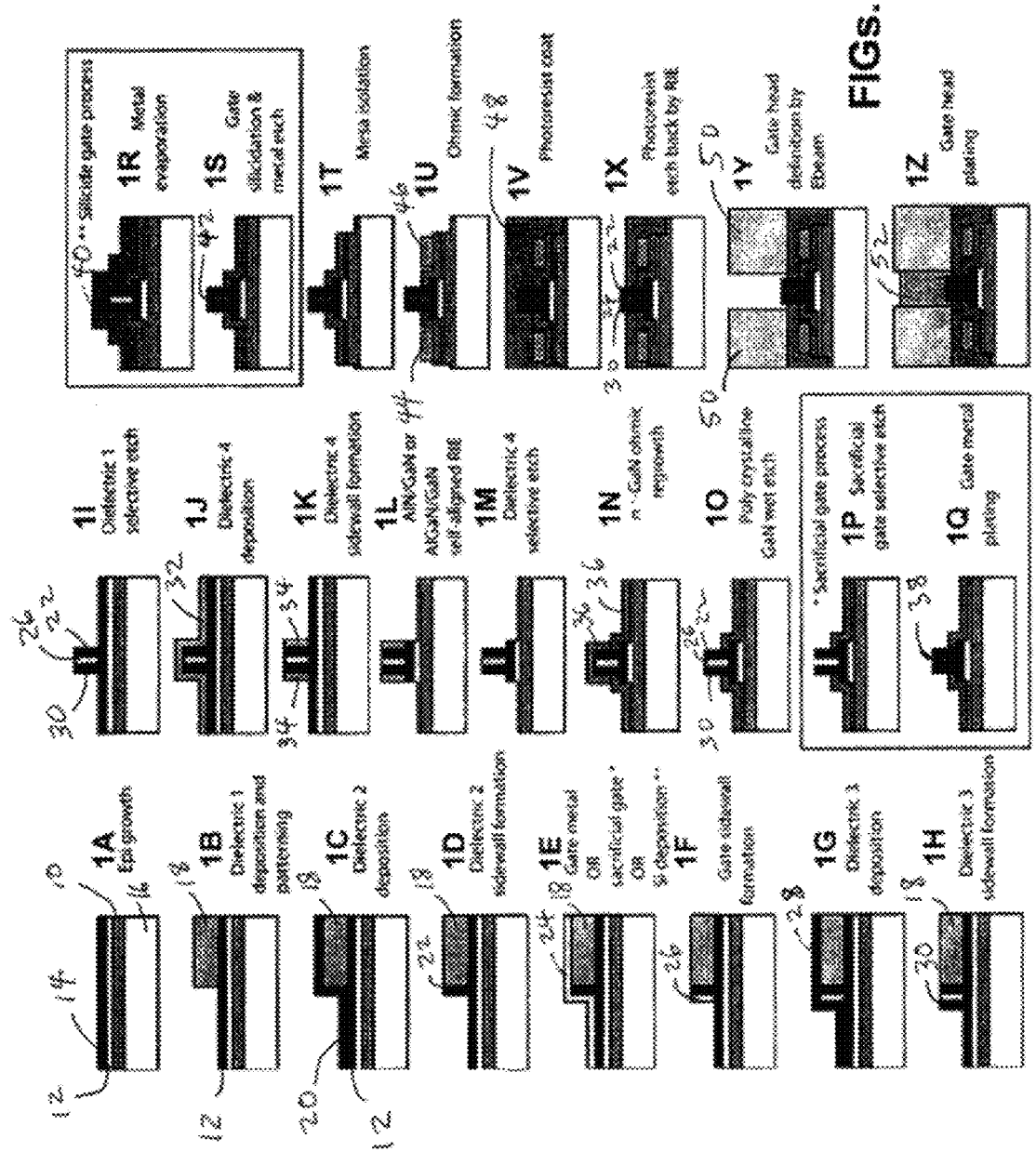
FIGS. 1A-1Z show a process flow for fabricating a GaN HEMT in accordance with the present disclosure.

FIGS. 1A-1Z show a process flow for fabricating a GaN HEMT in accordance with the present disclosure. FIGS. 3A-3F are flow diagrams of a method for fabricating a transistor with a self aligned gate in accordance with the present disclosure.

As shown in FIG. 1A and step 200 in FIG. 3A, epitaxial growth of a first epitaxial layer 10, which may be AlGaN, a second epitaxial layer 12, which may be GaN, and a third epitaxial layer 14, which may be AlGaN or AlN, is performed on a substrate 16, which may be sapphire, SiC, silicon, GaN, or other suitable materials.

At this point in the process optional step 202 in FIG. 3A may be performed to deposit a high-k gate dielectric film, such as $Al_2O_3$, $HfO_2$, $TiO_2$, etc. on the third epitaxial layer to reduce gate leakage and protect the epitaxial surface during subsequent processing.

Next, as shown in FIG. 1B and in step 204 in FIG. 3A, a first dielectric film 18 such as $SiO_2$, SiN, $Al_2O_3$, polymers, etc., is deposited using a deposition technique such as chemical vapor deposition (CVD), sputtering, atomic layer deposition (ALD), spin coating, etc. Then the first dielectric film 18 is patterned by optical lithography, and etching of the film in selected regions down to the third epitaxial layer 14 using dry plasma etching.

Then, as shown in FIG. 1C and in step 206 in FIG. 3A, a second dielectric film 20 is deposited such as $SiO_2$. SiN, $Al_2O_3$, polymers, etc., using a deposition technique such as CVD, sputtering, ALD, spin coating, etc., to the desired thickness.

Next, as shown in FIG. 1D and in step 208 in FIG. 3B, the second dielectric film 20 is dry plasma etched by reactive ion etching (RIE), or inductively-coupled plasma reactive ion etching (ICP-RIE), etc., to form a first sidewall dielectric spacer 22.

Optionally step 210 in FIG. 3B may be performed. Step 210 may be performed at this point instead of step 202. A high-k gate dielectric film, such as $Al_2O_3$, $HfO_2$, $TiO_2$, etc., may be deposited at this point to reduce gate leakage and protect the epitaxial surface during subsequent processing. This would result in ALD under the gate as well as an ALD sidewall to one side of the gate. Deposition of the ALD layer at this point instead of in step 202 would prevent damage and etching of the ALD layer under the gate during dry etch processes in steps 204 and 208.

Next, as shown in FIG. 1E and in step 212 in FIG. 3B, a refractory gate material 24 is deposited, such as W, TiW, Ta, Mo, TaN, etc., using evaporation, sputtering, ALD, etc.

In an alternative method in step 212 a sacrificial gate 24 is deposited such as silicon or a dielectric material for subsequent removal via selective etching and gate material plating as shown in FIGS. 1P and 1Q.

In another alternative method a silicon gate 24 is deposited by CVD for subsequent alloying/silicidation as shown in FIGS. 1R and 1S.

Next, as shown in FIG. 1F and in step 214 in FIG. 3C, a dry plasma etch of the gate material 24, sacrificial gate 24 or silicon gate 24, by reactive ion etching (RIE), or inductively-coupled plasma reactive ion etching (ICP-RIE), etc., forms a sidewall gate 26.

Then, as shown in FIG. 1G and in step 216 in FIG. 3C, a third dielectric film 28 such as $SiO_2$, SiN, $Al_2O_3$, polymers, etc., is deposited using a deposition technique such as CVD, sputtering, ALD, spin coating, etc., to a desired thickness for a sidewall dielectric spacer.

Next, as shown in FIG. 1H and in step 218 in FIG. 3C, the third dielectric film 28 is dry plasma etched by reactive ion etching (RIE), or inductively-coupled plasma reactive ion etching (ICP-RIE), etc., to form second sidewall dielectric spacer 30.

Then, as shown in FIG. 1I and in step 220 in FIG. 3D, the first dielectric film 18 is selectively wet etched.

Next, as shown in FIG. 1J and in step 222 in FIG. 3D, a fourth dielectric film 32 such as $SiO_2$, SiN, $Al_2O_3$, polymers, etc., is deposited using a deposition technique such as CVD, sputtering, ALD, spin coating etc. This film thickness defines the dimension of the n+ ledge during ohmic regrown in step 230, which reduces access resistance by increasing the channel charge under the ledge and improving contact to the 2DEG, as described in U.S. patent application Ser. No. 12/792,529, filed Jun. 2, 2010, which has above been incorporated herein by reference as though set forth in full.

Then, as shown in FIG. 1K and in step 224 in FIG. 3D, the fourth dielectric film 32 is dry plasma etched by reactive ion etching (RIE), or inductively-coupled plasma reactive ion etching (ICP-RIE), etc., to form sidewalls 34.

Next, as shown in FIG. 1L and in step 226 in FIG. 3D, a reactive ion etch of third epitaxial layer 14, which may be a Schottky layer with recess into the second epitaxial layer 12, which may be a buffer layer, in order to allow contact between 2DEG and subsequent regrown n+ contacts. Examples of third Schottky and second buffer layers include AlGaN/GaN, AlN/GaN, GaN/AlN/GaN, etc.

Then, as shown in FIG. 1M and in step 228 in FIG. 3D, the fourth dielectric film 32 is selectively wet etched to form an n+ ledge for subsequent ohmic regrowth.

Next, as shown in FIG. 1N and in step 230 in FIG. 3E, n+ material 36 for ohmic contacts such as n+ GaN, n+InN, or n+ InGaN is selectively regrown by molecular beam epitaxy (MBE) or metalorganic chemical vapor deposition (CVD).

Then, as shown in FIG. 1O and in step 232 in FIG. 3E, a selective wet etch removes defective (polycrystalline) regrown material from the first and second dielectric spacers 22 and 30 and gate 26.

Next, the steps shown in FIGS. 1P and 1Q and in step 234 in FIG. 3E are skipped in the case of depositing gate material 24 in step 212. If a sacrificial gate 24 is deposited in step 212, then as shown in FIGS. 1P and 1Q and in step 234 in FIG. 3E a selective wet etch of the remaining sacrificial gate 26 is performed and then gate material such as Pt, Pd, or Ni is deposited via electroplating.

In the case that a silicon gate 24 is deposited in step 212, then the steps shown in FIGS. 1P and 1Q are skipped and instead the steps shown in FIGS. 1R and 1S are performed and in step 234 a silicide gate (for example, NiSi or PtSi) is formed by evaporation or sputtering of metal 40 for alloying with silicon to form the silicide gate 42 and then selective etching of the non-alloyed metal.

Figure 3F:
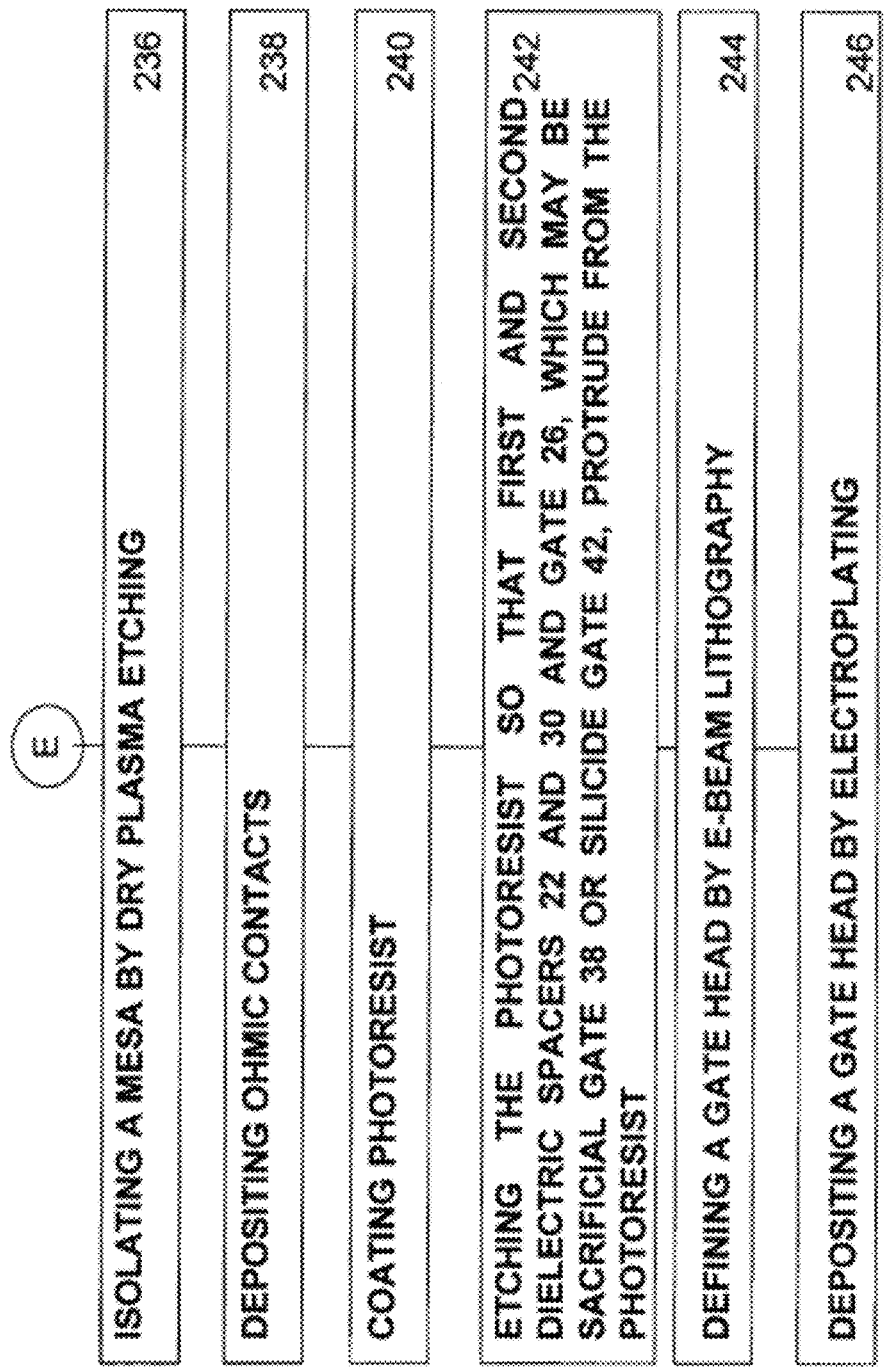

Then, as shown in FIG. 1T and in step 236 in FIG. 3F, a mesa is isolated via dry plasma etching.

Next, as shown in FIG. 1U and in step 238 in FIG. 3F, ohmic contacts 44 and 46 are deposited.

Then, as shown in FIG. 1V and in step 240 in FIG. 3F, a photoresist 48 is coated.

Next, as shown in FIG. 1X and in step 242 in FIG. 3F, the photoresist 48 is etched back so that first and second dielectric spacers 22 and 30 and gate 26, which may be sacrificial gate 38 or silicide gate 42, protrude from the photoresist.

Then, as shown in FIG. 1Y and in step 244 in FIG. 3F, gate head definition 50 is formed by e-beam lithography.

Finally, as shown in FIG. 1Z and in step 246 in FIG. 3F, a gate head 52 is deposited by electroplating.

Figure 2:
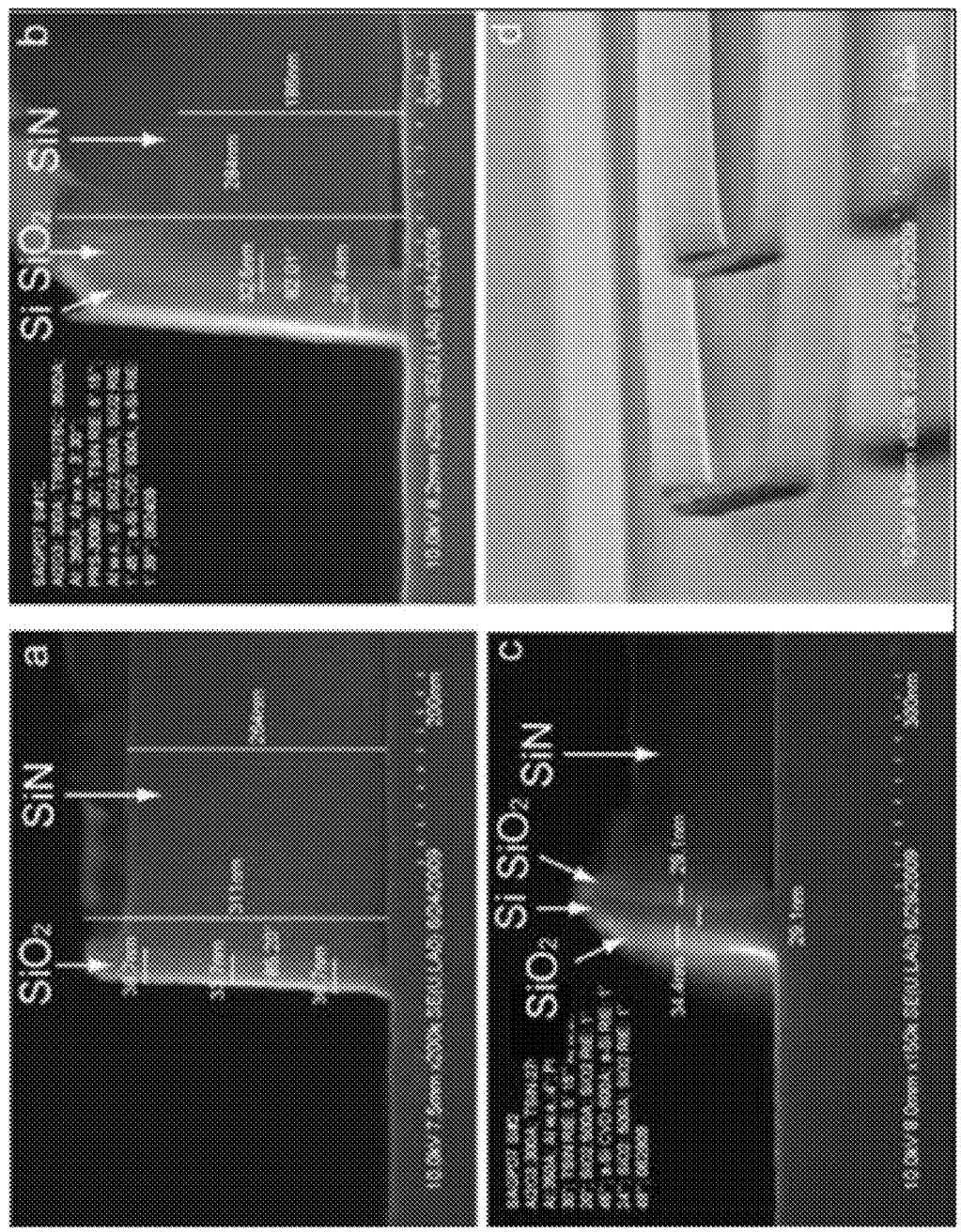
FIG. 2 shows SEM images of a preliminary demonstration of the sidewall gate process using a sacrificial Si gate and SiO2 dielectric spacers in accordance with the present disclosure.

FIG. 2 shows SEM images of a preliminary demonstration of the sidewall gate process using a sacrificial Si gate and $SiO_2$ dielectric spacers: a) SiN box with $SiO_2$ sidewall spacer, corresponding to FIG. 1D, b) SiN box with SiO2 spacer and Si sacrificial gate, corresponding to FIG. 1F, c) Si sacrificial gate with two $SiO_2$ sidewall spacers and SiN box, corresponding to FIG. 1H, and d) sidewall gate structure after removal of SiN box, corresponding to FIG. 1I.

All layers were deposited by PECVD. The resulting structure had a dielectric spacer thickness of 29-34 nm and a silicon sacrificial gate thickness of 29 nm. This initial work demonstrates the feasibility of fabrication of very short gate length GaN HEMTs using the sidewall fabrication process described herein.

Figure 4:
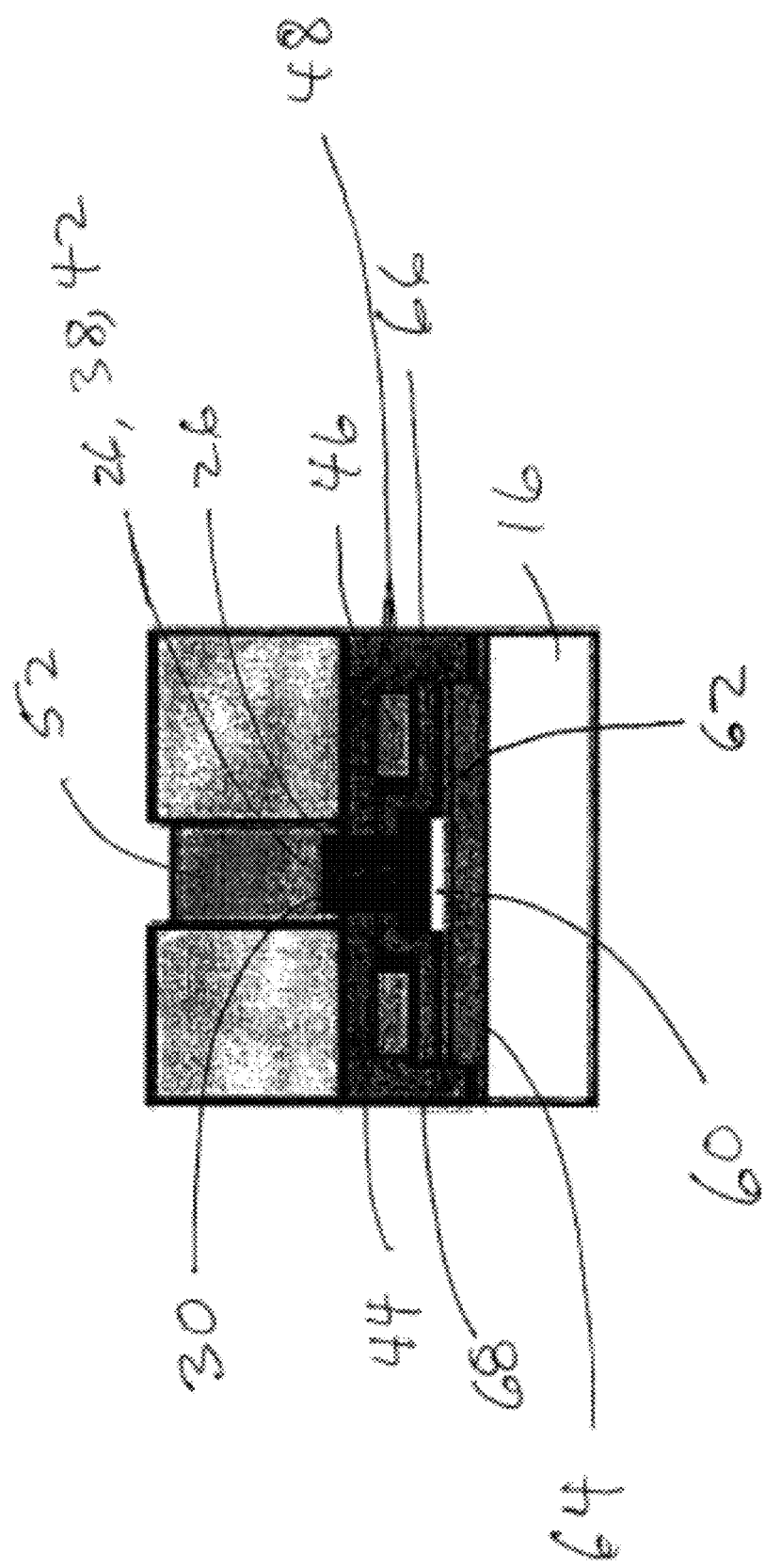
FIG. 4 is a larger view of FIG. 1Z, showing a transistor with a self aligned gate in accordance with the present disclosure.

FIG. 4 is a larger view of FIG. 1Z, showing a transistor with a self aligned gate in accordance with the present disclosure. First and second dielectric spacers 22 and 30 and gate 26, which may be sacrificial gate 38 or silicide gate 42 as described above, are shown. The first and second dielectric spacers 22 and 30 separate gate 26 from ohmic contact for the drain 66, which is connected to contact 46, and from ohmic contact for the source 68, which is connected to contact 44. Top barrier 62, which is a portion of the third epitaxial layer 14, is directly below the first and second dielectric spacers 22 and 30 and gate 26. As described above the top barrier 62 may be AlGaN, AlN, or GaN/AlN.

Channel 60, which is a portion of the second epitaxial layer 12, is directly below the top barrier 62 and as described above may be GaN. Buffer layer 64, which is the first epitaxial layer 10, is directed below the channel 60, and as described above may be AlGaN. Below the buffer layer 64 is the substrate 16, which as described above may be sapphire, SiC, silicon, or GaN.

The device of FIG. 4 has an ultra-short, high aspect ratio gate and ultra-short source-drain spacings, which improves gate length and source-drain spacing uniformity and reduces contact and access resistance.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . ." and no method or process step herein is to be construed under those provisions unless the step, or steps, are expressly recited using the phrase "comprising the step(s) of . . . ."

What is claimed is:

1. A method of fabricating a GaN HEMT comprising:
growing a first epitaxial layer on a substrate;
growing a second epitaxial layer on the first epitaxial layer;
growing a third epitaxial layer on the second epitaxial layer;
depositing a first dielectric film on the third epitaxial layer;
patterning the first dielectric film;
etching the first dielectric film in selected regions down to the third epitaxial layer;
depositing a second dielectric film over the remaining first dielectric film and an exposed portion of the third epitaxial layer to a desired thickness;
etching the second dielectric film to form a first sidewall dielectric spacer;
depositing a gate material;
etching of the gate material to form a sidewall gate;
depositing a third dielectric film to a desired thickness;
etching the third dielectric film to form a second sidewall dielectric spacer;
selectively wet etching the first dielectric film;
depositing a fourth dielectric film;
etching the fourth dielectric film to form sidewalls;
reactive ion etching the third epitaxial layer with recess into the second epitaxial layer in order to allow contact between a 2DEG and regrown n+ ohmic contacts; and
selectively wet etching the fourth dielectric film to form an n+ ledge for ohmic contact regrowth.

2. The method of claim 1 further comprising:
selectively regrowing n+ material such as n+ GaN, n+ InN, or n+ InGaN on the second epitaxial layer and the n+ ledge for ohmic contacts;
selective wet etching to remove defective regrown material from the first and second sidewall dielectric spacers and the sidewall gate;
isolating a mesa by dry plasma etching;
depositing ohmic contacts;
coating photoresist;
etching the photoresist so that the first and second sidewall dielectric spacers and the sidewall gate protrude from the photoresist;
defining a gate head by e-beam lithography; and
depositing a gate head by electroplating.

3. The method of claim 1 wherein:
the first epitaxial layer comprises AlGaN;
the second epitaxial layer comprises GaN; and
the third epitaxial layer comprises AlGaN or AlN; and
the substrate comprises sapphire, SiC, silicon, or GaN.

4. The method of claim 1:
wherein the first dielectric film comprises $SiO_2$, SiN, $Al_2O_3$, or polymers;
wherein the second dielectric film comprises $SiO_2$, SiN, $Al_2O_3$, or polymers;
wherein the third dielectric film comprises $SiO_2$, SiN, $Al_2O_3$, or polymers; and
wherein the fourth dielectric film comprises $SiO_2$, SiN, $Al_2O_3$, or polymers.

5. The method of claim 1:
wherein depositing a first dielectric film comprises using a deposition technique such as chemical vapor deposition (CVD), sputtering, atomic layer deposition (ALD), or spin coating;
wherein depositing a second dielectric film comprises using a deposition technique such as chemical vapor deposition (CVD), sputtering, atomic layer deposition (ALD), or spin coating;
wherein depositing a third dielectric film comprises using a deposition technique such as chemical vapor deposition (CVD), sputtering, atomic layer deposition (ALD), or spin coating; and
wherein depositing a fourth dielectric film comprises using a deposition technique such as chemical vapor deposition (CVD), sputtering, atomic layer deposition (ALD), or spin coating.

6. The method of claim 1:
wherein etching the first dielectric film comprises dry plasma etching using reactive ion etching (RIE) or inductively-coupled plasma reactive ion etching (ICP-RIE)
wherein etching the second dielectric film comprises dry plasma etching using reactive ion etching (RIE) or inductively-coupled plasma reactive ion etching (ICP-RIE)
wherein etching the third dielectric film comprises dry plasma etching using reactive ion etching (RIE) or inductively-coupled plasma reactive ion etching (ICP-RIE)
wherein etching the fourth dielectric film comprises dry plasma etching using reactive ion etching (RIE) or inductively-coupled plasma reactive ion etching (ICP-RIE).

7. The method of claim 1:
wherein the gate material is refractory gate material comprising W, TiW, Ta, Mo, or TaN;
wherein depositing the gate material comprises using evaporation, sputtering, or ALD; and
wherein etching the gate material comprises dry plasma etching using reactive ion etching (RIE) or inductively-coupled plasma reactive ion etching (ICP-RIE).

8. The method of claim 1:
wherein etching the first dielectric film in selected regions down to the third epitaxial layer comprises using dry plasma etching.

9. The method of claim 1 further comprising depositing a high-k gate dielectric film, such as Al2o3, $HfO_2$, or $TiO_2$, on the third epitaxial layer to reduce gate leakage and protect the epitaxial surface.

10. A method of fabricating a GaN HEMT comprising:
growing a first epitaxial layer on a substrate;
growing a second epitaxial layer on the first epitaxial layer;
growing a third epitaxial layer on the second epitaxial layer;
depositing a first dielectric film on the third epitaxial layer;
patterning the first dielectric film;

etching the first dielectric film in selected regions down to the third epitaxial layer;
depositing a second dielectric film over the remaining first dielectric film and an exposed portion of the third epitaxial layer to a desired thickness;
etching the second dielectric film to form a first sidewall dielectric spacer;
depositing a sacrificial gate comprising silicon or a dielectric material;
etching of the sacrificial gate to form a sacrificial sidewall gate;
depositing a third dielectric film to a desired thickness;
etching the third dielectric film to form a second sidewall dielectric spacer;
selectively wet etching the first dielectric film;
depositing a fourth dielectric film;
etching the fourth dielectric film to form sidewalls;
reactive ion etching the third epitaxial layer with recess into the second epitaxial layer in order to allow contact between a 2DEG and regrown n+ ohmic contacts; and
selectively wet etching the fourth dielectric film to form an n+ ledge for ohmic contact regrowth.

11. The method of claim 10 further comprising:
selectively regrowing n+ material such as n+ GaN, n+ InN, or n+ InGaN on the second epitaxial layer and the n+ ledge for ohmic contacts;
selective wet etching to remove defective regrown material from the first and second sidewall dielectric spacers and the sidewall gate;
selective wet etching to remove the sacrificial sidewall gate;
depositing gate material comprising Pt, Pd, or Ni by electroplating to replace the sacrificial sidewall gate with a sidewall gate;
isolating a mesa by dry plasma etching;
depositing ohmic contacts;
coating photoresist;
etching the photoresist so that the first and second sidewall dielectric spacers and the sidewall gate protrude from the photoresist;
defining a gate head by e-beam lithography; and
depositing a gate head by electroplating.

12. The method of claim 10 wherein:
the first epitaxial layer comprises AlGaN;
the second epitaxial layer comprises GaN; and
the third epitaxial layer comprises AlGaN or AlN; and
the substrate comprises sapphire, SiC, silicon, or GaN.

13. The method of claim 10:
wherein the first dielectric film comprises $SiO_2$, SiN, $Al_2O_3$, or polymers;
wherein the second dielectric film comprises $SiO_2$, SiN, $Al_2O_3$, or polymers;
wherein the third dielectric film comprises $SiO_2$, SiN, $Al_2O_3$, or polymers; and
wherein the fourth dielectric film comprises $SiO_2$, SiN, $Al_2O_3$, or polymers.

14. The method of claim 10:
wherein depositing a first dielectric film comprises using a deposition technique such as chemical vapor deposition (CVD), sputtering, atomic layer deposition (ALD), or spin coating;
wherein depositing a second dielectric film comprises using a deposition technique such as chemical vapor deposition (CVD), sputtering, atomic layer deposition (ALD), or spin coating;
wherein depositing a third dielectric film comprises using a deposition technique such as chemical vapor deposition (CVD), sputtering, atomic layer deposition (ALD), or spin coating; and
wherein depositing a fourth dielectric film comprises using a deposition technique such as chemical vapor deposition (CVD), sputtering, atomic layer deposition (ALD), or spin coating.

15. The method of claim 10:
wherein etching the first dielectric film comprises dry plasma etching using reactive ion etching (RIE) or inductively-coupled plasma reactive ion etching (ICP-RIE)
wherein etching the second dielectric film comprises dry plasma etching using reactive ion etching (RIE) or inductively-coupled plasma reactive ion etching (ICP-RIE)
wherein etching the third dielectric film comprises dry plasma etching using reactive ion etching (RIE) or inductively-coupled plasma reactive ion etching (ICP-RIE)
wherein etching the fourth dielectric film comprises dry plasma etching using reactive ion etching (RIE) or inductively-coupled plasma reactive ion etching (ICP-RIE).

16. The method of claim 10:
wherein depositing the sacrificial gate comprises using evaporation, sputtering, or ALD; and
wherein etching the sacrificial gate comprises dry plasma etching using reactive ion etching (RIE) or inductively-coupled plasma reactive ion etching (ICP-RIE).

17. The method of claim 10:
wherein etching the first dielectric film in selected regions down to the third epitaxial layer comprises using dry plasma etching.

18. The method of claim 10 further comprising depositing a high-k gate dielectric film, such as Al2o3, $HfO_2$, or $TiO_2$, on the third epitaxial layer to reduce gate leakage and protect the epitaxial surface.

19. A method of fabricating a GaN HEMT comprising:
growing a first epitaxial layer on a substrate;
growing a second epitaxial layer on the first epitaxial layer;
growing a third epitaxial layer on the second epitaxial layer;
depositing a first dielectric film on the third epitaxial layer;
patterning the first dielectric film;
etching the first dielectric film in selected regions down to the third epitaxial layer;
depositing a second dielectric film over the remaining first dielectric film and an exposed portion of the third epitaxial layer to a desired thickness;
etching the second dielectric film to form a first sidewall dielectric spacer;
depositing a silicon gate by chemical vapor deposition (CVD);
etching the silicon gate to form a silicon sidewall gate;
depositing a third dielectric film to a desired thickness;
etching the third dielectric film to form a second sidewall dielectric spacer;
selectively wet etching the first dielectric film;
depositing a fourth dielectric film;
etching the fourth dielectric film to form sidewalls;
reactive ion etching the third epitaxial layer with recess into the second epitaxial layer in order to allow contact between a 2DEG and regrown n+ ohmic contacts; and
selectively wet etching the fourth dielectric film to form an n+ ledge for ohmic contact regrowth.

20. The method of claim 19 further comprising:
selectively regrowing n+ material such as n+ GaN, n+ InN, or n+ InGaN on the second epitaxial layer and the n+ ledge for ohmic contacts;
selective wet etching to remove defective regrown material from the first and second sidewall dielectric spacers and the silicon sidewall gate;
forming a silicide sidewall gate by evaporation or sputtering of a metal to alloy with the silicon sidewall gate;
selectively etching the nonalloyed metal;
isolating a mesa by dry plasma etching;
depositing ohmic contacts;
coating photoresist;
etching the photoresist so that the first and second sidewall dielectric spacers and the silicide sidewall gate protrude from the photoresist;
defining a gate head by e-beam lithography; and
depositing a gate head by electroplating.

21. The method of claim 19 wherein:
the first epitaxial layer comprises AlGaN;
the second epitaxial layer comprises GaN; and
the third epitaxial layer comprises AlGaN or AlN; and
the substrate comprises sapphire, SiC, silicon, or GaN.

22. The method of claim 19:
wherein the first dielectric film comprises $SiO_2$, SiN, $Al_2O_3$, or polymers;
wherein the second dielectric film comprises $SiO_2$, SiN, $Al_2O_3$, or polymers;
wherein the third dielectric film comprises $SiO_2$, SiN, $Al_2O_3$, or polymers; and
wherein the fourth dielectric film comprises $SiO_2$, SiN, $Al_2O_3$, or polymers.

23. The method of claim 19:
wherein depositing a first dielectric film comprises using a deposition technique such as chemical vapor deposition (CVD), sputtering, atomic layer deposition (ALD), or spin coating;
wherein depositing a second dielectric film comprises using a deposition technique such as chemical vapor deposition (CVD), sputtering, atomic layer deposition (ALD), or spin coating;
wherein depositing a third dielectric film comprises using a deposition technique such as chemical vapor deposition (CVD), sputtering, atomic layer deposition (ALD), or spin coating; and
wherein depositing a fourth dielectric film comprises using a deposition technique such as chemical vapor deposition (CVD), sputtering, atomic layer deposition (ALD), or spin coating.

24. The method of claim 19:
wherein etching the first dielectric film comprises dry plasma etching using reactive ion etching (RIE) or inductively-coupled plasma reactive ion etching (ICP-RIE)
wherein etching the second dielectric film comprises dry plasma etching using reactive ion etching (RIE) or inductively-coupled plasma reactive ion etching (ICP-RIE)
wherein etching the third dielectric film comprises dry plasma etching using reactive ion etching (RIE) or inductively-coupled plasma reactive ion etching (ICP-RIE)
wherein etching the fourth dielectric film comprises dry plasma etching using reactive ion etching (RIE) or inductively-coupled plasma reactive ion etching (ICP-RIE).

25. The method of claim 19:
wherein etching the silicon gate comprises dry plasma etching using reactive ion etching (RIE) or inductively-coupled plasma reactive ion etching (ICP-RIE).

26. The method of claim 19:
wherein etching the first dielectric film in selected regions down to the third epitaxial layer comprises using dry plasma etching.

27. The method of claim 19 further comprising depositing a high-k gate dielectric film, such as Al2o3, $HfO_2$, or $TiO_2$, on the third epitaxial layer to reduce gate leakage and protect the epitaxial surface.

* * * * *